United States Patent [19]

Schulte

[11] 4,391,032
[45] Jul. 5, 1983

[54] METHOD FOR MANUFACTURING INTEGRATED DYNAMIC RAM ONE-TRANSISTOR STORAGE CELLS

[75] Inventor: Heinz Schulte, Munich, Fed. Rep. of Germany

[73] Assignee: Siemens Aktiengesellschaft, Berlin and Munich, Fed. Rep. of Germany

[21] Appl. No.: 282,706

[22] Filed: Jul. 13, 1981

[30] Foreign Application Priority Data

Aug. 29, 1980 [DE] Fed. Rep. of Germany ....... 3032632

[51] Int. Cl.³ .................... H01L 21/20; B01J 17/00; H01L 27/04
[52] U.S. Cl. .................... 29/571; 29/576 B; 29/577 C; 148/1.5; 148/187; 357/23; 357/51; 357/91
[58] Field of Search .......... 148/1.5, 187; 29/571, 29/576 B, 577 C; 357/23 C, 23 S, 51, 91

[56] References Cited

U.S. PATENT DOCUMENTS

| | | | |
|---|---|---|---|
| 4,055,444 | 10/1977 | Rao | 148/1.5 |
| 4,125,933 | 11/1978 | Baldwin et al. | 29/571 |
| 4,208,670 | 6/1980 | Hoffmann et al. | 29/571 |
| 4,240,092 | 12/1980 | Kuo | 357/41 |
| 4,240,195 | 12/1980 | Clemens et al. | 29/571 |
| 4,249,194 | 2/1981 | Rogers | 29/577 C |
| 4,265,685 | 5/1981 | Seki | 148/174 |

FOREIGN PATENT DOCUMENTS 2382769 9/1978 France .

*Primary Examiner*—Upendra Roy
*Attorney, Agent, or Firm*—Herbert L. Lerner; Laurence A. Greenberg

[57] ABSTRACT

Method for manufacturing dynamic RAM one-transistor storage cells in a semiconductor chip with each cell having one integrated field effect transistor and one integrated capacitor. A semiconductor substrate surface is covered in part by a thin oxide layer and in part by a thick oxide structure. The thin oxide layer is subjected to a first ion implantation. A doped polycrystalline semiconductor material is deposited over the entire surface. The polycrystalline layer is structured by means of a photoresist mask and the underlying layers at the open places etched away to expose substrate surface. The mask is removed. A second thin oxide layer is created by oxidation over the entire surface. A second ion implantation implants ions in the second oxide layer. A second doped layer of polycrystalline material is deposited over the second layer. The second polycrystalline layer is structured by a suitable phototechnique to produce a polycrystalline structure semiconductor layer.

3 Claims, 5 Drawing Figures

METHOD FOR MANUFACTURING INTEGRATED DYNAMIC RAM ONE-TRANSISTOR STORAGE CELLS

BACKGROUND OF THE INVENTION

1. Field of the Invention

The invention relates to a method for manufacturing dynamic RAM (random access memory) one-transistor storage cells integrated in a semiconductor chip, consisting of one each integrated field-effect transistor and one integrated capacitor, in which the oxide structures are applied in a manner known per se, for instance, by means of locos processes by means of a photolithographically given pattern on a semiconductor surface.

2. Description of the Prior Art

In the preparation of such storage cells, one endeavors to generate capacitance as large as possible and at the same time, to reduce the area required on the chip.

To create capacitance as large as possible, a weakly doped semiconductor substrate is usually used and the insulator capacity under the capacitor is made as large as possible which, however, leads generally to a relatively small insulator layer thickness. The capacitor structures and the field-effect transistor structures are worked into the semiconductor body by means of photolithographic processes. However, in photolithographic processes, certain adjustment tolerances are given, below which one cannot go.

One-transistor cells generated thereby therefore require a certain amount of space on the semiconductor chip which cannot be reduced appreciably because of the adjustment tolerances of the photolithographic processes. Since however, the area required by storage cells in a chip is an important factor for their use in the construction of memories, it is desirable to reduce this space.

SUMMARY OF THE INVENTION

It is therefore an object of the present invention to provide a method for manufacturing dynamic RAM one-transistor storage cells integrated in a semiconductor chip, which storage cells require little space and in which the capacity of the capacitors is large.

With the foregoing and other objects in view, there is provided, in accordance with the invention, a method for manufacturing dynamic RAM one-transistor storage cells integrated in a semiconductor chip, each cell having an integrated field-effect transistor and an integrated capacitor, in which the oxide structures are applied by means of photographically predetermined patterns on a semiconductor surface, which comprises, (a) applying an oxide structure to the surface of a semiconductor substrate with part of the semiconductor surface covered by a thick oxide structure serving as an implantation mask and another part of the surface covered by a thin oxide layer, (b) subjecting the thin oxide layer to a first ion implantation to implant the first ions into the thin oxide layer, and if desired, into the semiconductor substrate near the surface;

(c) depositing a first layer of doped polycrystalline semiconductor material over the oxide surface;

(d) structuring the first polycrystalline layer by means of a photoresist mask to expose part of the surface of the semiconductor substrate covered by the thin oxide layer by etching away at the open spaces of the photoresist mask, the underlying layers of the polycrystalline layer, the thin oxide layer, and if necessary, a surface layer of semiconductor substrate to remove the ions implanted near the surface, and removing the photoresist mask;

(e) applying by oxidation a second thin oxide layer over the exposed part of the surface of the semiconductor as well as the first polycrystalline layer;

(f) subjecting the second thin oxide layer to a second ion implantation to implant second ions into the second thin oxide layer and if desired, into the semiconductor substrate near the surface;

(g) forming a first doped region in the semiconductor substrate covered by the first thin oxide layer by diffusion of ions from the first thin oxide layer;

(h) depositing a second doped layer of polycrystalline material over the second oxide layer;

(i) structuring the second polycrystalline layer to remove part of the second polycrystalline layer from the second thin oxide layer covering the semiconductor substrate surface, and forming a second doped region in the substrate below the area of removal of the second polycrystalline layer.

Other features which are considered as characteristic for the invention are set forth in the appended claims.

Although the invention is illustrated and described herein as embodied in method for manufacturing integrated dynamic RAM one-transistor storage cells, it is nevertheless not intended to be limited to the details shown, since various modifications may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with the accompanying drawings, in which.

DETAILED DESCRIPTION OF THE INVENTION

Figure 1:
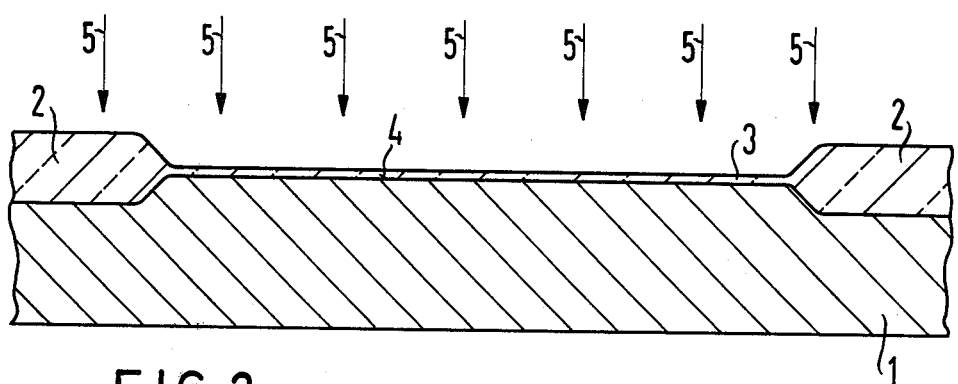
FIG. 1 diagrammatically shows as a sectional view, a semiconductor substrate provided with a thick oxide structure.

In accordance with the invention, locos processes are employed and a first ion implantation is made with thick oxide zones serving as implantation masks. A first ion type is implanted over the entire area. Thereupon a first layer of polycrystalline semiconductor material is deposited over the entire surface. Then the first polycrystalline layer is structured by means of a predetermined photoresist mask. At the free portions of the photoresist mask, the underlying layer, namely the polycrystalline layer, and the oxide layer are etched off. If the first implantation takes place in a semiconductor layer close to the surface, this semiconductor layer is also etched off. Thereupon the photoresist mask is dissolved off.

Then an oxidation over the entire surface of the free semiconductor surface portions as well as of the polycrystalline semiconductor layer takes place.

Thereupon, a second ion implantation is performed over the entire surface which is self-adjusting with respect to the edges of the first polycrystalline semiconductor layer. A second polycrystalline layer is then deposited over the entire surface. Thereafter, the second polycrystalline semiconductor layer is structured by a suitable photo technique.

This method has the advantage that the structures can be kept very small because of the self-adjusting first implantation, and the space required on the chip is therefore very small. A further advantage of the method according to the invention is the improvement of the capacitance, because with this method, a p-n capacity shunted across the oxide capacity is generated in the interior of the semiconductor due to the fact that the ions implanted by means of the first implantation under the capacitor oxide layer diffuse into the semiconductor body by subsequent temperature steps such as are provided by the subsequent oxidations of the semiconductor surface, and create a p-n junction in the interior.

It is also part of the invention that the second polycrystalline semiconductor layer is structured so that an additional diffusion or implantation in the semiconductor single crystal takes place self-adjusting with respect to the edges of the second polycrystalline semiconductor layer and edges of the thick oxide as well as possibly also with respect to edges of the first polycrystalline semiconductor layer.

This method is particularly advantageous if under the first polycrystalline layer, an additional p-n capacity is to be incorporated. The fact that the diffusion or implantation of these zones takes place self-adjusting relative to the polycrystalline layers deposited thereon, again has the advantage of saving in adjustment tolerances and thereby reducing the space required on the chip.

Depending on the requirements of the component to be manufactured, it is advantageous if the doping of the first and the second polycrystalline layer takes place during or after the deposition of these layers.

It frequently is also advantageous if the first implantation is made into the semiconductor single crystal, or into an oxide layer deposited on the zones to be implanted with subsequent diffusion on the implanted ions into the semiconductor crystal.

By this method, the implanted ions can be diffused in subsequent temperature steps such as, for instance, in the oxidation, into the semiconductor region underneath, whereby at the same time the diffusion profile of these ions in the semiconductor body can be kept narrow, whereas in the case of diffusion in the semiconductor body, all subsequent temperature steps enlarge the diffusion profile. Furthermore, when structuring the surface by etching which takes place ahead of the second implantation, only the polycrystalline layer and the oxide layer need be removed. Thereby, the semiconductor surface remains approximately flat in the area of the capacitor as well as of the MOS (metal oxide semiconductor) transistors, which has advantages when generating the photolithographic structure.

It is also part of the invention that the first ion implantation generates a conduction type of the first kind in the semiconductor regions to be doped, while the second ion implantation generates in the regions to be doped, a conduction type of a second kind which is opposite that of the conduction type of the first kind. Through this choice of implantation, capacitors and MOS transistors according to the invention, can be deposited, for instance, physically close together.

It is also advantageous to use silicon as the semiconductor material. Using silicon as the semiconductor material has the advantage that mature and well proven procedures are available in this field, for which reason, components made accordingly can be produced in a technically simple and cost-saving manner.

It is also advantageous to use as the single crystal semiconductor material, p-conducting silicon and for the first implantation an ion type with a small diffusion coefficient from the fifth group of the periodic system of the elements, for instance arsenic. For the second implantation an ion type from the third group of the periodic system, for instance boron is used. Using ion types with a small diffusion coefficient in the first implantation has the advantage that diffusion or implantation profiles once formed in the semiconductor crystal are not expanded as much by subsequent temperature steps.

The invention will be explained in the following in greater detail making reference to the drawings and embodiment examples.

FIG. 1 shows a semiconductor substrate 1, to which thick-oxide structures 2 and thin-oxide layers 3 have been applied on the surface 4. The arrows 5 indicate a first implantation which can be made either into the thin oxide layers 3 or into the layers of the semiconductor substrate 1 near the surface. If p-conducting silicon is used as the semiconductor substrate 1, a depletion implantation with arsenic, for instance, can be made in the first implantation.

In the following figures, like objects are provided with the same reference symbols as in FIG. 1, for which reason they are not described again.

Figure 2:
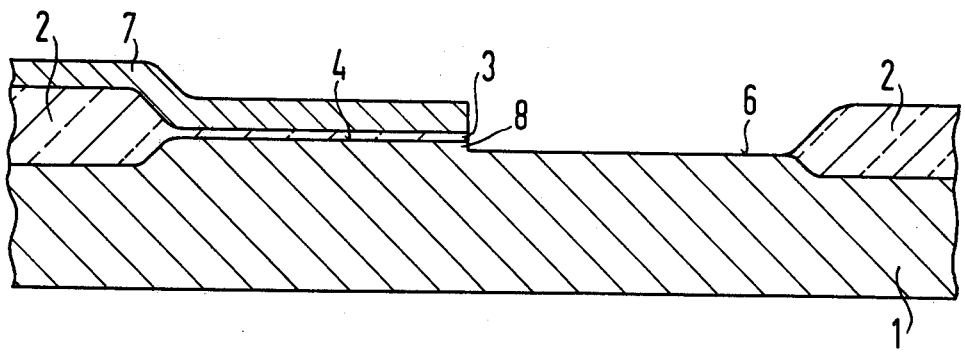
FIG. 2 is a semiconductor substrate like FIG. 1 with a structured first polycrystalline layer.

FIG. 2 shows a semiconductor substrate 1 like FIG. 1, in which, after the first implantation, a polycrystalline, doped first silicon layer is first deposited over the entire surface and is subsequently structured, for instance, by means of a phototechnique in such manner that the structured polycrystalline silicon layer 7 results. In this structuring, the first polycrystalline layer on top of the silicon surface portions 6 which have been exposed, for instance, by plasma etching, as well as the thin oxide layer 3 are removed. If the first implantation takes place in layers of the semiconductor substrate near the surface, these layers near the surface which are located outside the structured polycrystalline layer 7 are removed with the other layers, for instance by means of plasma etching. The silicon surface portions 6 produced thereby have a level difference relative to the original surface 4, which is indicated by the step 8.

If implantation takes place into the thin oxide layer 3, the latter is merely removed, for which reason step 8 is not produced. The deposition and doping of the first polycrystalline silicon layer advantageously takes place at so low a temperature (about 500° C.) that diffusion of the first implantation out of the oxide into the semiconductor substrate is at first prevented.

Figure 3:
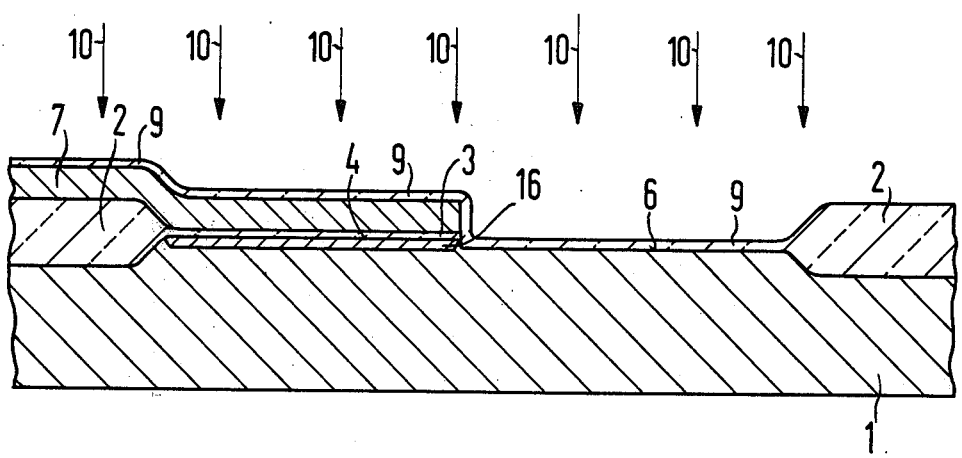
FIG. 3 is a semiconductor substrate like FIG. 2 with oxide coating and a first doped region.

FIG. 3 shows a semiconductor substrate like FIG. 2, on which a thin oxide layer 9 is deposited over the entire surface. If this oxide layer is applied by thermal oxidation, for instance, at 1000° C., then the ions of the first implantation diffuse from the remaining oxide layer 3 or the layers of the semiconductor substrate 1 close to the surface under the remaining oxide layer 3, into the interior of the semiconductor substrate 1 and there form the first doped region 16. The arrows 10 indicate a second implantation which is made either into the thin oxide layer 9 or into layers of the semiconductor substrate 1 near the surface under the silicon surface portion 6. This implantation can, for instance, be an enhancement implantation and be made by means of boron.

Figure 4:
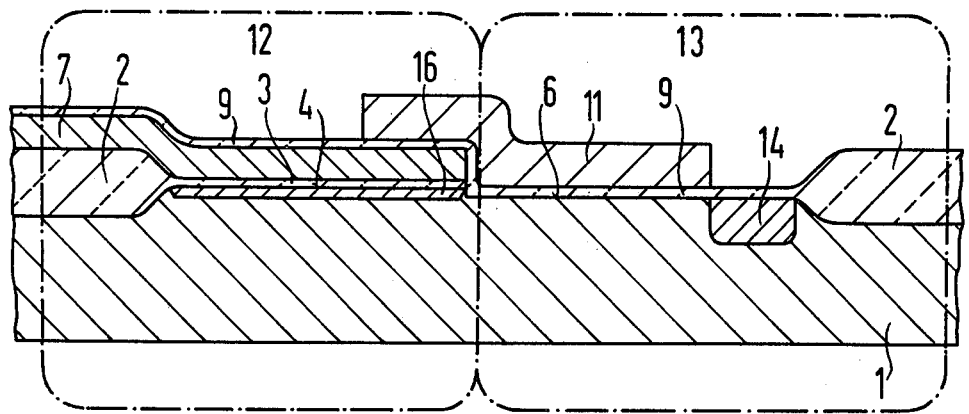
FIG. 4 is a semiconductor substrate like FIG. 3 with a structured second polycrystalline layer and a second doped region and, FIG. 5 is a semiconductor substrate like FIG. 4 with a second structured polycrystalline layer and a third doped region.

FIG. 4 shows a semiconductor substrate 1 like FIG. 3, on which a second polycrystalline, doped and structured silicon layer 11 is applied. The doping of the polycrystalline silicon layer 11 can be made either during the deposition process or after. The polycrystalline silicon layer 11 is at first applied over the entire surface and is subsequently structured, for instance, by means of a phototechnique in such a way that a second doped region 14 is worked in, self-adjusting, into the semiconductor substrate 1. The structure according to FIG. 4 can already function as a one-transistor cell of a dynamically integrated semiconductor memory, where the part 12, indicated by dashed-dotted lines, represents a capacitor, with the leads between the polycrystalline doped silicon layer 7 and the semiconductor substrate 1; and the part 13, indicated by dashed-dotted lines, represents an MOS field-effect transistor. The polycrystalline doped silicon layer 11 forms the gate.

Figure 5:
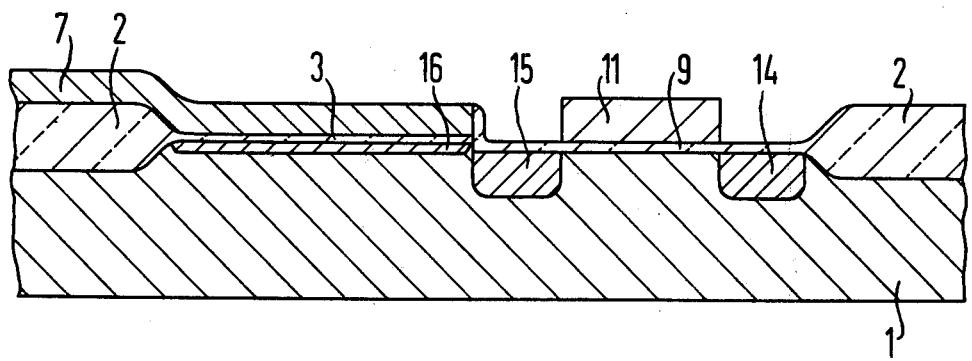

FIG. 5 shows a semiconductor substrate 1 like FIG. 4, in which the polycrystalline, doped silicon layer 11 is structured so that a third doped region 15 is worked into the semiconductor substrate 1, self-adjusting.

Depending on the requirements, MOS storage cells are made according to FIG. 4 or FIG. 5. The doped regions 14 and 15 of 16 serve here as source and/or drain regions.

To carry out the method according to the invention, a p-doped silicon substrate can be used as the preferred semiconductor substrate. However, other semiconductor materials and mirror-symmetrical doping can also be used. After the application of locos structures, as indicated in FIG. 1, the first-implantation is first made which serves to produce the p-n capacity in the capacitor. In the case of p-doped silicon substrate, the implantation can preferably be made by means of arsenic ions. It is important for the choice of the type of ions that it have a low diffusion coefficient with respect to the semiconductor material used. After the first implantation, the first polysilicon layer is deposited initially over the entire surface. This can be done by decomposing silane at about 500° C. and subsequent deposition of silicon on the semiconductor surface. To obtain doped polysilicon, arsenic for instance, can be fed into reaction vessel, so that a doped polysilicon layer is deposited from the start. However, the doping of the polysilicon layer can also be made subsequently by implantation. Then the first structuring of the polysilicon layer 7, shown in FIG. 2, is made. If only the polysilicon layer and the thin oxide layer underneath it are to be removed in certain parts of the chip, but the silicon substrate surface is not to be attacked, then it is advisable to remove the polysilicon layer, for instance, by means of plasma etching, while the silicon oxide layer is removed by wet chemical means. Prior to the plasma etching, an etching mask, for instance consisting of photoresist, can be applied, while the remaining polysilicon layers serve as a mask for the wet chemical process. However, in the case of an implantation into the semiconductor substrate, a part of the semiconductor substrate layer near the surface must also be removed at the same time. In this case, and if silicon is used as the semiconductor material, a plasma etching method can be used for etching the three materials, polysilicon, silicon oxide and the silicon layer near the surface. Besides plasma etching, sputter etching can also be used in the method according to the invention.

After the structuring of the polycrystalline layer 7, shown in FIG. 2, the entire surface is oxidized at about 1000° C. The arsenic ions not removed by the etching process then diffuse either from the oxide layer 3 or from layers near the surface underneath the thin oxide layer 3, into the interior of the semiconductor substrate 1 and form there the first doped region 16. The region 16 is therefore worked-in self-adjusting with respect to the polycrystalline silicon layer 7.

Subsequently, the second implantation, for instance, by means of boron ions as indicated in FIG. 3, is made self-adjusting, the remaining polycrystalline layer 7 bringing about this self-adjustment. Through the self-adjustment, adjusting tolerances of the otherwise customarily used photo masks are eliminated, whereby the structures made accordingly ccan be kept substantially smaller, which brings about the advantage of smaller are a requirement on the semiconductor chip. Thereupon, the second polycrystalline, doped layer 11 is deposited initially over the entire surface, the doping and structuring of which can be made in a manner similar to the first polycrystalline layer 7. If the structuring of the second polycrystalline silicon layer 11 brings about structures, such as are shown in FIG. 4 or FIG. 5, then the doped regions 14 and 15 are worked-in also self-adjusting.

The method according to the invention can be used for the manufacture of dynamic RAM memories and particularly for the manufacture of 64-K RAM memories.

There are claimed:

1. Method for manufacturing dynamic RAM one-transistor cells integrated in a semiconductor substrate, each cell consisting of one field-effect transistor and one storage capacitor, which comprises
    (a) insulating areas of the semiconductor substrate for the one-transistor cells by thick oxide structures to insulate the cells from each other and covering the areas for the cells between the thick oxide structures with first thin oxide layers,
    (b) forming an electrode for the storage capacitors by applying a first polycrystalline semiconductor layer over the entire surface of the thick oxide structures and the first thin oxide layers, and structuring by etching in the areas of the semiconductor substrate together with the first thin oxide layers, to leave remaining on the storage capacitor parts of the one-transistor cell areas of the semiconductor substrate a layer sequence of thin oxide as a capacitor dielectric and the polycrystalline layer as the capacitor electrode,
    (c) applying a second thin oxide layer over the entire surface to form a gate oxide for the transistors,
    (d) doping the transistor parts of the one-transistor cell areas of the semiconductor substrate by another ion implantation to adjust the cut-off voltage of the transistors,
    (e) forming the gate electrodes of the transistors, by applying a second polycrystalline semiconductor layer over the entire surface and structuring by etching to leave parts of the second polycrystalline semiconductor on the transistor parts of the one-transistor cell areas, the combination therewith of (f) adjusting the storage capacitors to a predetermined storage capacity after the thick oxide structures and the first thin oxide layers are formed, and using the thick oxide structures as a mask, subjecting the cell areas to an ion implantation for preparing a doped layer which with the semiconductor substrate forms a pn-junction in the storage capacitor parts in the semiconductor substrate, and (g) performing said another ion implantation for adjusting the cut-off voltage of the transfer transistors utilizing as a mask the parts of the first polycrystalline semiconductor layer which form the electrode of the storage capacitors.

2. Method according to claim 1, wherein the ion implantation for adjusting the storage capacity is performed that first, only a doping of the first thin oxide layers takes place, and subsequently when the second thin oxide layer is applied, the doping is incorporated by diffusion from the first thin oxide layers into the storage capacitor parts of the one-transistor cell areas of the semiconductor substrate.

3. Method according to claim 1, wherein in performing the ion implantation for adjusting the storage capacity the doping is incorporated through the first thin oxide layers into the one-transistor cell areas of the semiconductor substrate, and wherein in the structuring of the first polycrystalline semiconductor layer, the layers of the semiconductor substrate containing the doping in the transistor parts of the one-transistor cell areas are removed at the same time by etching.

* * * * *